United States Patent
Kim et al.

(10) Patent No.: US 9,583,702 B2
(45) Date of Patent: Feb. 28, 2017

(54) GRAPHENE-INSERTED PHASE CHANGE MEMORY DEVICE AND METHOD OF FABRICATING THE SAME

(71) Applicants: Samsung Electronics Co., Ltd., Suwon-si, Gyeonggi-do (KR); The Board of Trustees of the Leland Stanford Junior University, Palo Alto, CA (US)

(72) Inventors: Yongsung Kim, Suwon-si (KR); Chiyui Ahn, Palo Alto, CA (US); Aditya Sood, Palo Alto, CA (US); Eric Pop, Palo Alto, CA (US); H.-S. Philip Wong, Palo Alto, CA (US); Kenneth E. Goodson, Palo Alto, CA (US); Scott Fong, Palo Alto, CA (US); Seunghyun Lee, Palo Alto, CA (US); Christopher M. Neumann, Palo Alto, CA (US); Mehdi Asheghi, Palo Alto, CA (US)

(73) Assignees: Samsung Electronics Co., Ltd., Gyeonggi-do (KR); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 15/011,199

(22) Filed: Jan. 29, 2016

(65) Prior Publication Data
US 2016/0276585 A1     Sep. 22, 2016

Related U.S. Application Data (60) Provisional application No. 62/135,816, filed on Mar. 20, 2015.

(51) Int. Cl.
*H01L 29/06* (2006.01)
*H01L 23/52* (2006.01)
(Continued)

(52) U.S. Cl.
CPC ............. *H01L 45/128* (2013.01); *H01L 45/06* (2013.01); *H01L 45/126* (2013.01); *H01L 45/144* (2013.01); *H01L 45/16* (2013.01)

(58) Field of Classification Search
CPC ......... B82Y 40/00; B82Y 10/00; B82Y 15/00; H01B 1/04; C01B 31/0438; C01B 31/04; H01L 51/0045; H01L 29/66045; H01L 29/4908; H01L 51/0558; H01L 29/66431; H01L 29/78; H01L 29/42384; H01L 21/02376; H01L 29/66477; H01L 29/42348
(Continued)

(56) References Cited

U.S. PATENT DOCUMENTS 8,916,973 B1 *  12/2014  Kim ...................... H01L 23/345
                                                   257/750
9,082,856 B2 *   7/2015  Chen ................... H01L 29/4908

FOREIGN PATENT DOCUMENTS

KR      100695166 B1    3/2007
KR     20070031714 A    3/2007
(Continued)

*Primary Examiner* — Hsien Ming Lee
(74) *Attorney, Agent, or Firm* — Harness, Dickey & Pierce, P.L.C.

(57) ABSTRACT

Provided is a phase change memory device including a graphene layer inserted between a lower electrode into which heat flows and a phase change material layer, to prevent the heat from being diffused to an outside so as to efficiently transfer the heat to the phase change material layer, and a method of fabricating the phase change memory device. The phase change memory device includes a lower electrode; an insulating layer formed to enclose the lower electrode; a graphene layer formed on the lower electrode; a phase change material layer formed on the graphene layer and the insulating layer; and an upper electrode formed on the phase change material layer. Since a phase of the phase (Continued)

change material layer is changed at a small amount of driving current, the phase change memory device is fabricated to have a high driving speed and a high integration.

17 Claims, 9 Drawing Sheets

(51) Int. Cl.
    *H01L 21/20*     (2006.01)
    *H01L 21/4763*     (2006.01)
    *H01L 45/00*     (2006.01)

(58) Field of Classification Search
    USPC .............................................. 257/4, 29, 750
    See application file for complete search history.

(56) References Cited

FOREIGN PATENT DOCUMENTS

| KR | 20150021362 A | 3/2015 |
|---|---|---|
| WO | WO-2009153870 A1 | 12/2009 |

\* cited by examiner

GRAPHENE-INSERTED PHASE CHANGE MEMORY DEVICE AND METHOD OF FABRICATING THE SAME

CROSS-REFERENCE TO RELATED APPLICATION

This application claims the benefit of U.S. Provisional Application No. 62/135,816, filed on Mar. 20, 2015, in the United States Patent and Trademark Office, the disclosure of which is incorporated herein in its entirety by reference.

BACKGROUND

1. Field

The present disclosure relates to a graphene-inserted phase change memory device and a method of fabricating the same.

2. Description of the Related Art

As semiconductor products gradually have small volumes, they demand higher capacity data processing. An operation speed and/or an integration of a nonvolatile memory device used in such a semiconductor product are to be increased.

A technology that uses a phase change material as a nonvolatile memory device has been developed. Examples of the nonvolatile memory device include a phase change memory (PCM) device that uses a phase change material as a memory device. The memory device that uses the phase change material is a memory device that uses changes in a resistance caused by a phase change of a material, e.g., uses reversible changes in the phase of the material depending on an amplitude and a duration time of an applied voltage.

The PCM device may be scaled to an area having a several nanometer size and exhibit fast switching. Therefore, the PCM device takes center stage as a next generation memory. The PCM device has a faster speed and a more stable characteristic than a NOR device having a large size.

However, a speed of the PCM device may be improved so as to be used as a next generation memory that replaces a place of an NAND flash device regarded as a mainstream memory device. For this, consumption of driving power of a PCM is to be reduced. This is related to a driving speed, and thus crystallization and amorphousness of a phase change material may be fast performed according to a current input in terms of a structure of the PCM so as to increase the driving speed. Therefore, the PCM may be driven at a low current to increase the driving speed.

SUMMARY

Provided are a phase change memory device into which a graphene layer is inserted so as to have high heat transfer efficiency and a low driving current, and a method of fabricating the same.

Provided are a phase change memory device that controls a width of an inserted graphene layer to control a heat transfer amount, and a method of fabricating the same.

Additional aspects will be set forth in part in the description which follows and, in part, will be apparent from the description, or may be learned by practice of the presented example embodiments.

According to an aspect of an example embodiment, a phase change memory device includes: a lower electrode; an insulating layer configured to be formed so as to enclose the lower electrode; a graphene layer configured to be formed on the lower electrode; a phase change material layer configured to be formed on the graphene layer and the insulating layer; and an upper electrode configured to be formed on the phase change material layer.

The graphene layer may be formed only on the lower electrode and may not be formed on the insulating layer.

A width of the graphene layer may be equal to a width of the lower electrode.

The phase change material layer may include a germanium antimony tellurium (GST) material.

According to an aspect of another example embodiment, a phase change memory device includes: a lower electrode; an insulating layer configured to be formed so as to enclose the lower electrode; a graphene layer configured to be formed on the lower electrode and the insulating layer; a phase change material layer configured to be formed on the graphene layer; and an upper electrode configured to be formed on the phase change material layer.

The graphene layer may be formed to cover the lower electrode and parts of the insulating layer.

The graphene layer may be formed to cover the lower electrode and all of the insulating layer.

The phase change material layer may include a GST material.

According to an aspect of another example embodiment, a method of fabricating a phase change memory device, includes: sequentially forming an electrode layer and an insulating layer on a substrate; removing a part of the insulating layer to expose the electrode layer to an outside; forming a lower electrode in the removed part of the insulating layer and then planarizing an uppermost layer; forming a graphene layer on the lower electrode and the insulating layer; removing the graphene layer formed on the insulating layer; and sequentially forming a phase change material layer and an upper electrode on the graphene layer and the insulating layer.

The graphene layer may be formed by using a transfer method or a direct growth method.

The electrode layer and the lower electrode may be formed of a same material.

All of the graphene layer formed on the insulating layer may be removed.

A part of the graphene layer formed on the insulating layer may be removed.

According to an aspect of another example embodiment, a method of fabricating a phase change memory device, includes: sequentially forming an electrode layer and an insulating layer on a substrate; removing a part of the insulating layer to expose the electrode layer to an outside; forming a lower electrode in the removed part of the insulating layer and then planarizing an uppermost layer; forming a graphene layer on the lower electrode and the insulating layer; and sequentially forming a phase change material layer and an upper electrode on the graphene layer.

The graphene layer may be formed by using a transfer method or a direct growth method.

The electrode layer and the lower electrode may be formed of a same material.

The graphene layer may be formed to cover all of the lower electrode and the insulating layer.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when any part is referred to as being "connected to" or "coupled to" another part, it may be directly connected or coupled to the other part or intervening elements may be present. In contrast, when any part is referred to as including any element, it may further include other elements without excluding other elements.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1:
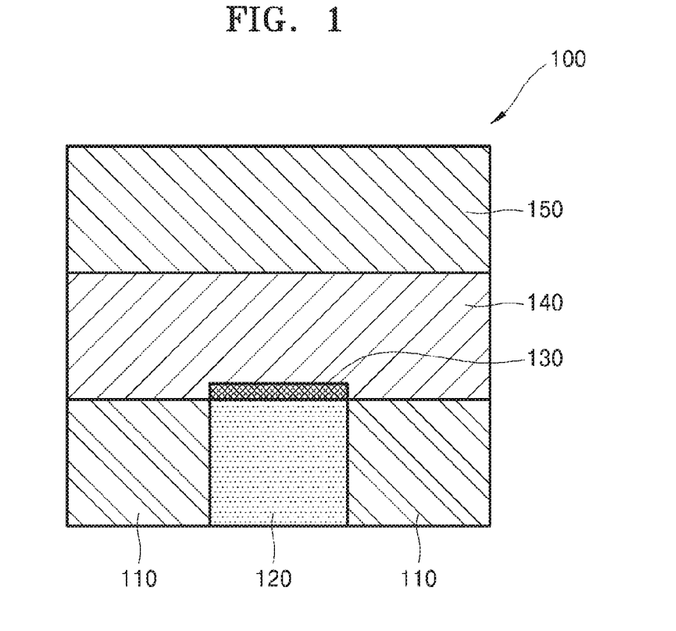
FIG. 1 is a schematic cross-sectional view of a structure of a phase change memory device according to an example embodiment.

FIG. 1 is a schematic cross-sectional view of a structure of a phase change memory device 100 according to an example embodiment.

Referring to FIG. 1, the phase change memory device 100 includes an insulating layer 110, a lower electrode 120, a graphene layer 130, a phase change material layer 140, and/or an upper electrode 150.

The insulating layer 110 may be formed to enclose the lower electrode 120 (this is not visible in the provided view, but would be visible from a view above). The insulating layer 110 may, for example, include at least one selected from a silicon oxide, a silicon nitride, and a silicon oxynitride.

The lower electrode 120 may be enclosed by the insulating layer 110. Since the drawing of FIG. 1 is a cross-sectional view, the insulating layer 110 is illustrated beside both sides of the lower electrode 120. However, the insulating layer 110 may be positioned in front or back of the lower electrode 120, e.g., in a vertical direction in the drawing. The insulating layer 110 encloses only sides of the lower electrode 120 and need not be formed on the lower electrode 120.

The lower electrode 120 may include a metal such as aluminum (Al), copper (Cu), tungsten (W) titanium (Ti), or tantalum (Ta), an alloy such as titanium tungsten (TiW) or titanium aluminum (TiAl), or carbon (C). The lower electrode 120 may also include titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boron nitride (TiBN), zirconium silicon nitride (ZrSiN), tungsten silicon nitride (WSiN), tungsten boron nitride (WBN), zirconium aluminum nitride (ZrAlN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium carbonitride (TiCN), or tantalum carbonitride (TaCN). Also, the lower electrode 120 may be a single layer including one single material of the above-mentioned materials, a single layer including a plurality of materials of the above-mentioned materials, a multilayer each including a single material of the above-mentioned materials, and/or a multilayer each including a plurality of materials of the above-mentioned materials.

The graphene layer 130 may be formed on the lower electrode 120. The graphene layer 130 may be positioned between the lower electrode 120 and the phase change material layer 140 or may directly contact the lower electrode 120 and the phase change material layer 140 to transfer heat generated from the lower electrode 120 to the phase change material layer 140. A width of the graphene layer 130 and a width of the lower electrode 120 may be equal to each other, and the graphene 130 need not be formed on the insulating layer 110. The graphene layer 130 may be formed to have the same width as the lower electrode 120 so as to enable heat, which flows into the lower electrode 120 when driving the phase change memory device 100, not to escape in a horizontal direction but enable the heat to transfer to the phase change material layer 140.

Since the graphene layer 130 has a high electrical conductivity, the graphene layer 130 may transfer a current input into the lower electrode 120 to the phase change material layer 140. Also, since the graphene layer 130 has a high heat conductivity, the graphene layer 130 may transfer the heat generated from the lower electrode 120 to the phase change layer material 140.

The phase change material layer 140 may be formed on the graphene layer 130 and the insulating layer 110. The phase change material layer 140 may directly contact the insulating layer 110 and the graphene layer 130. The phase change material layer 140 is electrically connected to the lower electrode 120. The graphene layer 130 is inserted between the phase change material layer 140 and the lower electrode 120. However, since the graphene layer 130 has a very high electrical conductivity, the phase change material layer 140 and the lower electrode 120 may be electrically connected to each other.

The phase change material layer 140 may be formed by using sputtering, chemical vapor deposition (CVD), plasma enhanced CVD (PECVD), atomic layer deposition (ALD), or the like. The phase change material layer 140 may include a phase change material, such as chalcogenide, that may store data according to different crystalline states. The phase change material may be a binary, tertiary, or quaternary material and include, for example, Ge—Te, Ge—Sb—Te, Ge—Te—Se, Ge—Te—As, Ge—Te—Sn, Ge—Te—Ti, Ge—Bi—Te, Ge—Sn—Sb—Te, Ge—Sb—Se—Te, Ge—Sb—Te—S, Ge—Te—Sn—O, Ge—Te—Sn—Au, Ge—Te—Sn—Pd, Sb—Te, Se—Te—Sn, Sb—Se—Bi, In—Se, In—Sb—Te, Sb—Se, Ag—In—Sb—Te, or a combination thereof. Also, the phase change material layer 140 may include only a phase change material or a phase change material to which dopant is added. The dopant may include C, N, Si, O, bismuth (Bi), tin (Sn), or a combination thereof. The dopant may be doped on the phase change material layer 140 to reduce a driving current of the phase change memory device 100. Also, the phase change material layer 140 may further include a metal material.

The upper electrode 150 may be formed on the phase change material layer 140. The upper electrode 150 may directly contact the phase change material layer 140. The upper electrode may also be electrically connected to the phase change material layer 140. The upper electrode 150 may include a metal such Al, Cu, W, Ti, or Ta, an alloy such as TiW or TiAl, or C. The upper electrode 150 may also include, TiN, TiAlN, TaN, WN, MoN, NbN, TiSiN, TiBN, ZrSiN, WSiN, WBN, ZrAlN, MoAlN, TaSiN, TaAlN, TiON, TiAlON, WON, TaON, TiCN, or TaCN. Also, the upper electrode 150 may include a single layer including one single material of the above-mentioned materials, a single layer including a plurality of materials of the above-mentioned materials, a multilayer each including a single material of the above-mentioned materials, and/or a multilayer each including a plurality of materials of the above-mentioned materials. The lower electrode 120 and the upper electrode 150 may be formed of the same material or different materials The phase change memory device 100 is basically driven by a current and has a structure in which heat generated by current driving is transferred to the lower electrode 120 of the phase change memory device 100. The lower electrode 120 may perform a function of a heater that changes a material state of the phase change material layer 140, e.g., changes a material state into a crystalline state or an amorphous state.

The phase change memory device 100 may store preset data according to a material state of the phase change material layer 140 formed between the lower electrode 120 and the upper electrode 150. For example, if the phase change material layer 140 is heated at temperature between a crystallization temperature and a melting temperature and then cooled, the phase change material layer 140 is changed into a crystalline state. The crystalline state is referred to as a set state or may be a state in which data "0" is stored. If the phase change material layer 140 is heated at a temperature higher than or equal to the melting temperature and then cooled, the phase change material layer 140 is changed into an amorphous state. The amorphous state is referred to as a reset state or may be a state in which data "1" is stored. Therefore, a current may be supplied to the phase change memory device 100 to store data, and a resistance value of the phase change material layer 140 may be measured to read data. A heating temperature of a phase change material is proportional to an amount of a current, and an increase in the amount of the current makes an achievement of a high integration difficult. Also, the change into the amorphous state (the reset state) demands a larger amount of current than the change into the crystalline state (the set state), and thus power consumption of a memory device increases. Therefore, a phase change material may be heated at a small amount of current to be changed into a crystalline state or an amorphous state so as to reduce power consumption. In particular, a current (e.g., a reset current) for a change into the amorphous state may be reduced to achieve the high integration.

Heat flowing into the lower electrode 120 due to current driving may be transferred to the phase change material layer 140 through the graphene layer 130. The graphene layer 130 has a higher heat conductivity in a thickness direction than in a width direction. Therefore, the heat flowing into the lower electrode 120 may not escape in a width direction of the graphene layer 130, e.g., in a horizontal direction, but may be efficiently transferred to the phase change material layer 140. Therefore, a driving current for driving the phase change memory device 100 may be lowered, and thus a driving speed of the phase change memory device 100 may also increase. Also, the phase change material layer 140 may be heated at a small amount of current to be changed into the amorphous state, and thus the high integration may be achieved.

Figure 2:
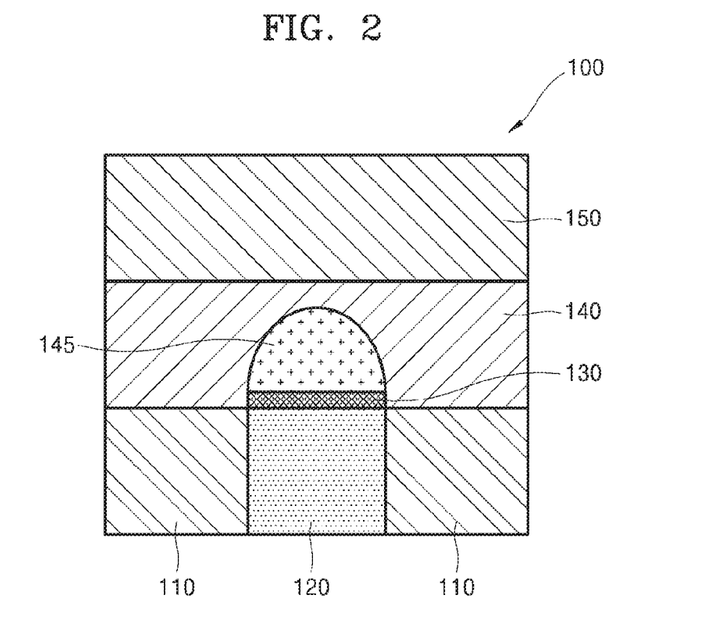
FIG. 2 is a cross-sectional view illustrating a phase of a phase change material that changes due to heat generated from a lower electrode in a phase change memory device, according to an example embodiment.

FIG. 2 is a cross-sectional view illustrating changes in a phase of the phase change material layer 140 caused by heat generated from the lower electrode 120 in the phase change memory device 100, according to an example embodiment.

Referring to FIG. 2, a driving current may flow into the phase change memory device 100 to heat the lower electrode 120. The lower electrode 120 that is heated may transfer the heat to the phase change material layer 140 through the graphene layer 130. The graphene layer 130 has the higher heat conductivity in the thickness direction than in the width direction. Therefore, the heat flowing into the lower electrode 120 may not get out in the horizontal direction but may be transferred in a vertical direction so as to change a phase of the phase change material layer 140. If the phase change material layer 140 is heated at a temperature higher than or equal to a preset temperature, the phase change material layer 140 may change the phase thereof to be changed into a phase change material layer 145 having an amorphous state. In FIG. 2, the phase change material layer 140 shows the crystalline state, and the phase change material layer 145 shows the amorphous state. The phase change material layer 140 having the crystalline state is in a set state, e.g., may be in a state in which data "0" is stored. The phase change material layer 145 having the amorphous state is in a reset state, i.e., may be in a state in which data "1" is stored.

The heat flowing into the lower electrode 120 may be quickly transferred in the width direction of the graphene layer 130, e.g., in the vertical direction, through the graphene layer 130. As a result, a loss of heat transferred to the phase change material layer 140 may be reduced or prevented. As the loss of the heat decreases, the phase change material layer 140 in the crystalline state may be changed into the phase change material layer 145 in the amorphous state only at a small amount of driving current. Therefore, a manual speed of the phase change memory device 100 may quicken and may be realized as a device having a high integration.

FIGS. 3A through 3F are cross-sectional views illustrating a method of fabricating a phase change memory device according to an example embodiment.

Figure 3A:
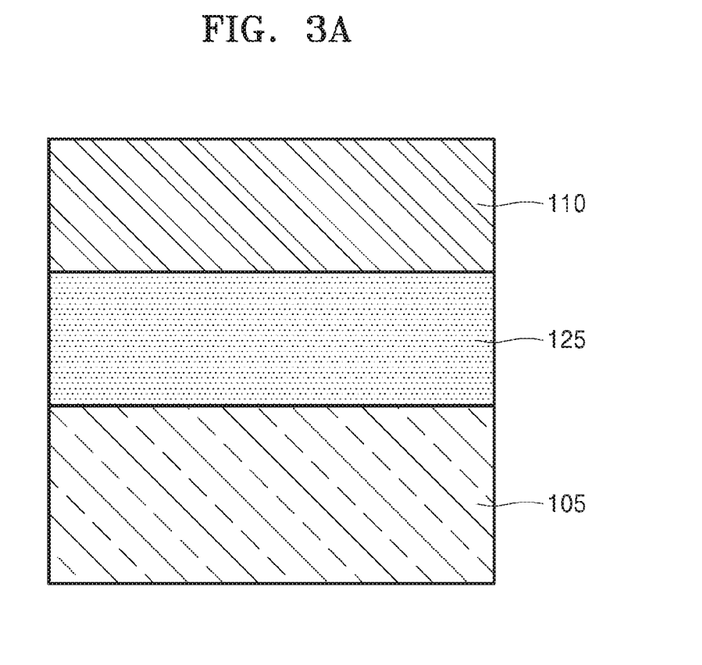
FIGS. 3A through 3F are cross-sectional views illustrating a method of fabricating a phase change memory device according to an example embodiment.

Referring to FIG. 3A, an electrode layer 125 and an insulating layer 110 are sequentially formed on a substrate 105.

The substrate 105 may include a semiconductor material, e.g., a group IV semiconductor, a group III-V compound semiconductor, or a group II-VI oxide semiconductor. For example, the group IV semiconductor may include silicon (Si), germanium (Ge), or silicon (Si)-germanium (Ge). The substrate 105 may be provided as a bulk wafer or an epitaxial layer. Alternatively, the substrate 105 may be a substrate such as a Silicon On Insulator (SOI) substrate, a gallium (Ga)-arsenic (As) substrate, a Si—Ge substrate.

The electrode layer 125 may be formed on the substrate 105 and may include a metal such as Al, Cu, W, Ti, or Ta, an alloy such as TiW or TiAl, or C.

The insulating layer 110 may be formed on the electrode layer 125 and may include at least one selected from silicon oxide, silicon nitride, and a silicon oxynitride.

Figure 3B:
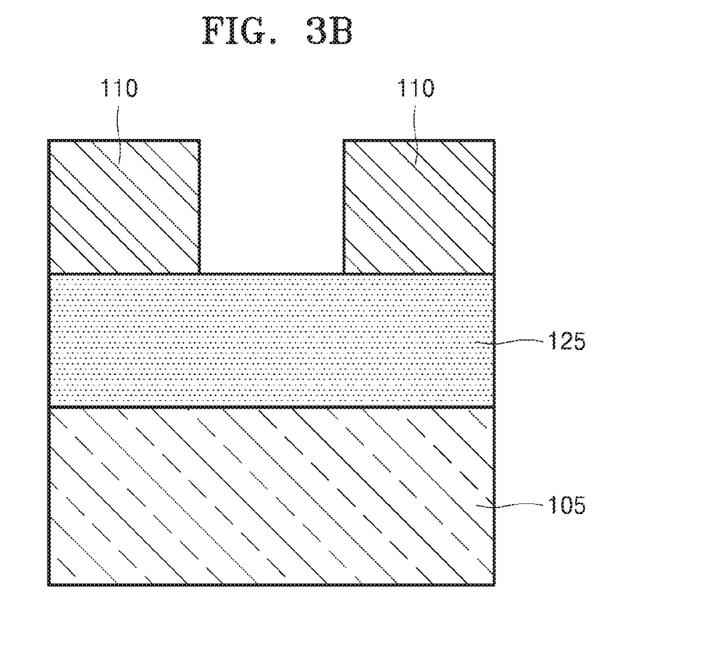

Referring to FIG. 3B, a part of the insulating layer 110 may be patterned to expose the electrode layer 125. The insulating layer 110 may be patterned by using a normal photography method, an etch method, a chemical mechanical polishing (CMP) method, a dry etch method, or the like. The above-described process may form a hole in the insulating layer 110 and expose the electrode layer 125 to the outside.

Figure 3C:
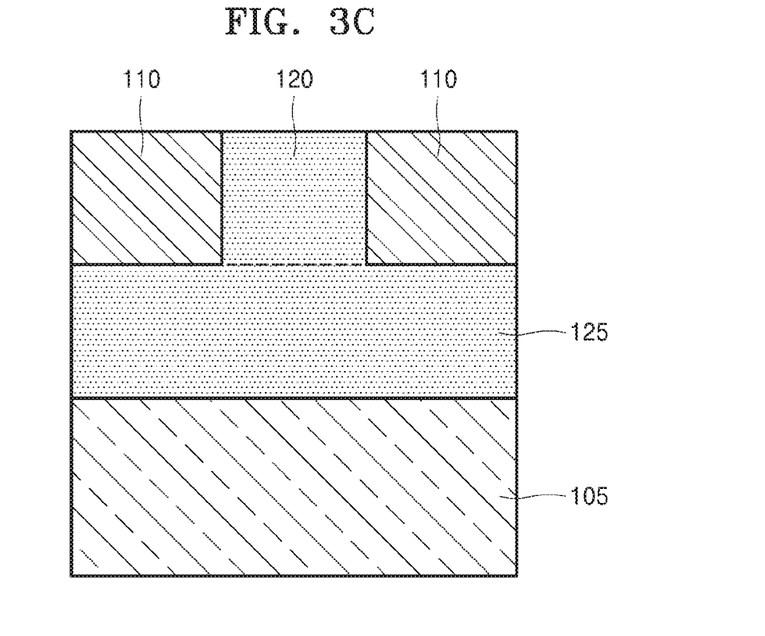

Referring to FIG. 3C, the lower electrode 120 may be formed in the hole formed by the patterning of the insulating layer 110. The lower electrode 120 may be formed by using sputtering, CVD, PECVD, ALD, or the like. The lower electrode 120 may include TiN, TiAlN, TaN, WN, MoN, NbN, TiSiN, TiBN, ZrSiN, WSiN, WBN, ZrAlN, MoAlN, TaSiN, TaAlN, TiON, TiAlON, WON, TaON, TiCN, or TaCN.

The lower electrode 120 may be formed of the same material as that of which the electrode layer 125 is formed. However, the electrode layer 120 need not be formed of the same material as the electrode layer 125 and thus may be formed of a different material from the electrode layer 125 so as to be electrically connected to the electrode layer 125.

The lower electrode 120 may be formed in the patterned part of the insulating layer 110, and then uppermost layers of the lower electrode 120 and the insulating layer 110 may be planarized.

Figure 3D:
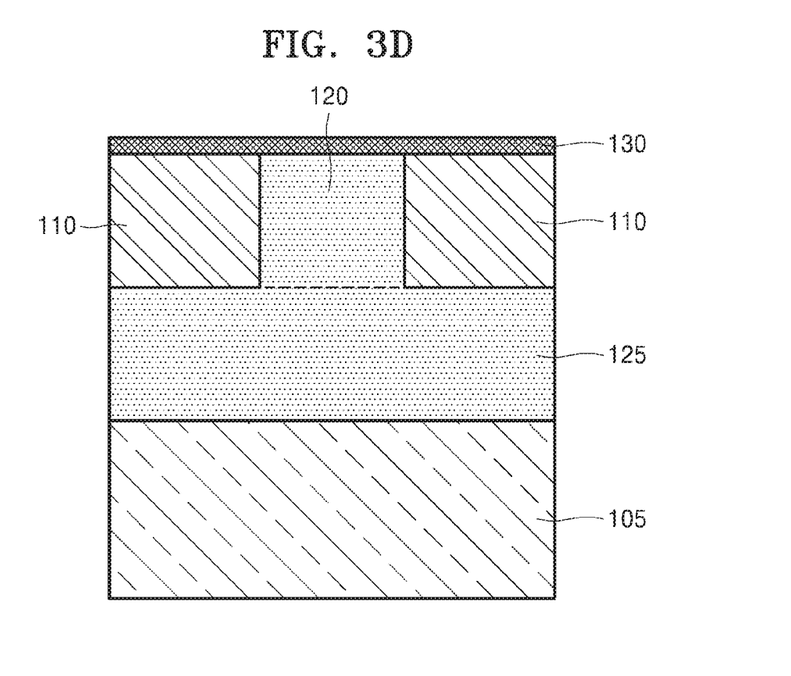

Referring to FIG. 3D, the graphene layer 130 may be formed on the lower electrode 120 and the insulating layer 110 that are planarized. A graphene may be fabricated by using CVD and then transferred onto the lower electrode 120 and the insulating layer 110 so as to form the graphene layer 130. Also, the graphene layer 130 may be formed on the lower electrode 120 and the insulating layer 110 by using a direct growth method.

Figure 3E:
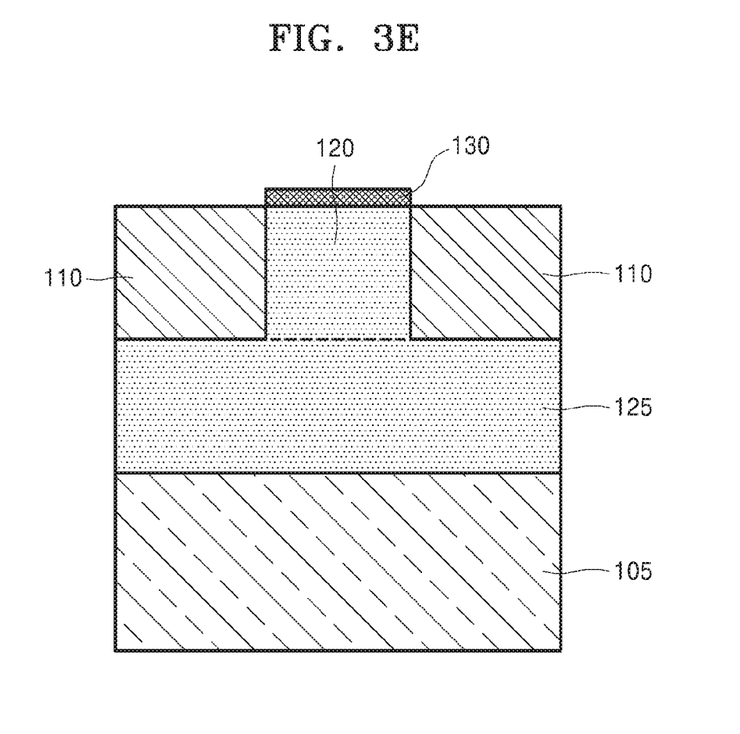

Referring to FIG. 3E, an other part of the graphene layer 130 except a part of the graphene layer 130 formed on the lower electrode 120, e.g., a part of the graphene layer 130 formed on the insulating layer 110, may be removed by a method such as an etch or the like. Therefore, a width of the graphene layer 130 and a width of the lower electrode 120 may become equal.

The part of the graphene layer 130 except the other part of the graphene layer 130 formed on the lower electrode 120, e.g., only a part of the graphene layer 130 formed on the insulating layer 110, may be etched and removed. In example embodiments, the width of the graphene layer 130 may be wider than the width of the lower electrode 120. The graphene layer 130 that is formed wider than the lower electrode 120 may diffuse heat, which flows into the lower electrode 120, through the graphene layer 130 in a width direction (a horizontal direction) of the graphene layer 130. Therefore, a width of a part of the graphene layer 130 that is formed on the insulating layer 110 and removed by etching may be controlled to control an amount of heat transferred to the phase change material layer 140.

Figure 3F:
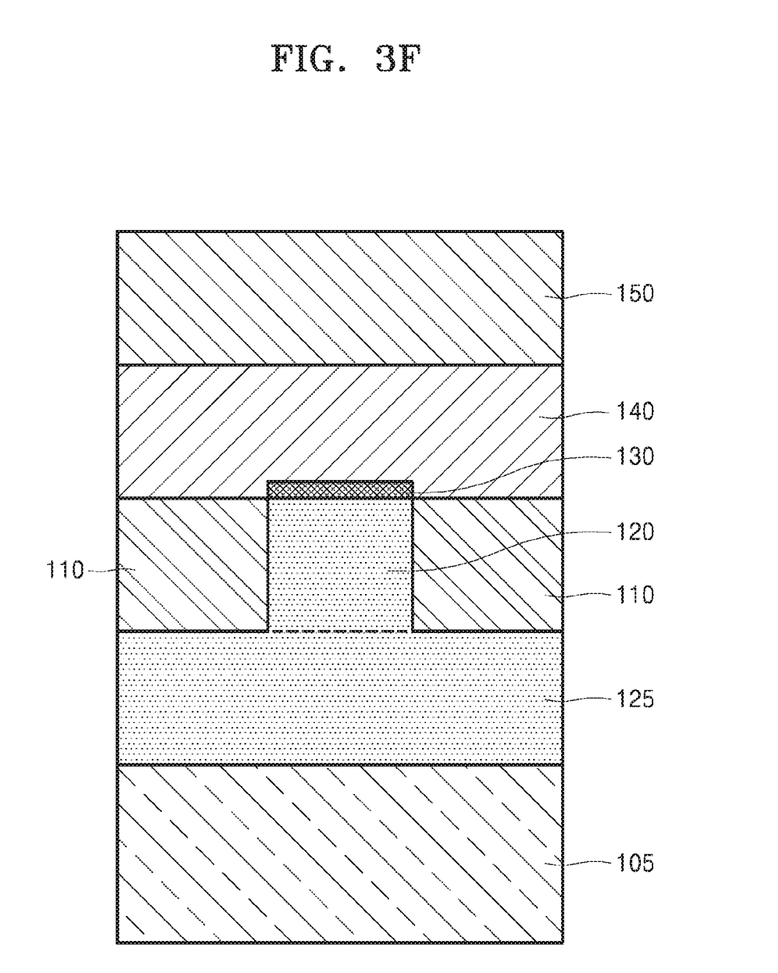

Referring to FIG. 3F, the phase change material layer 140 and the upper electrode 150 may be sequentially formed on the graphene layer 130 and the insulating layer 110. The phase change material layer 140 and the upper electrode 150 may be formed by using sputtering, CVD, PECVD, ALD, or the like.

Figure 4:
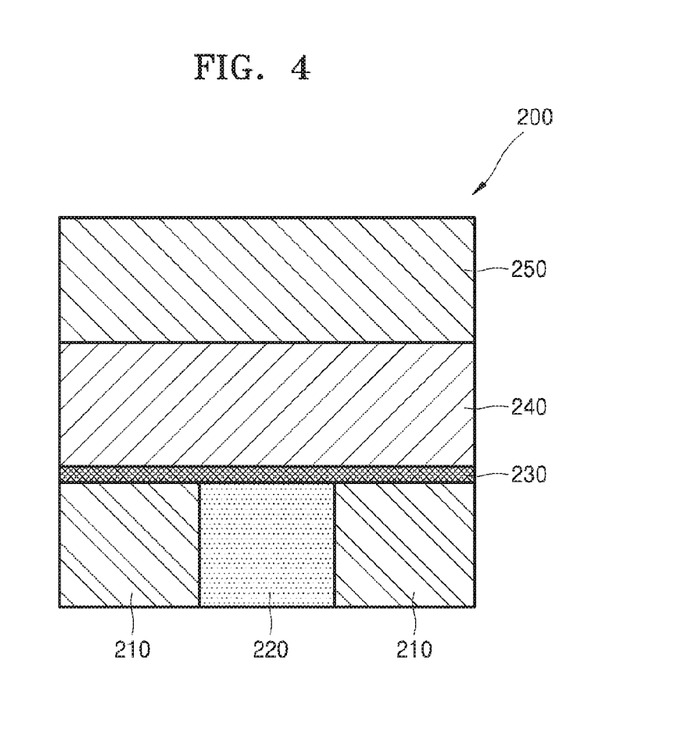
FIG. 4 is a schematic cross-sectional view of a structure of a phase change memory device according to another example embodiment.

FIG. 4 is a schematic cross-sectional view of a structure of a phase change memory device 200 according to another example embodiment.

Referring to FIG. 4, the phase change memory device 200 includes an insulating layer 210, a lower electrode 220, a graphene layer 230, a phase change material layer 240, and an upper electrode 250.

The insulating layer 210 may be formed to enclose the lower electrode 220. The insulating layer 210 may, for example, include at least one selected from silicon oxide, silicon nitride, and silicon oxynitride.

The lower electrode 220 may be enclosed by the insulating layer 210. Since the drawing of FIG. 4 is a cross-sectional view, the insulating layer 210 is illustrated beside only both sides of the lower electrode 220. However, in FIG. 4, the insulating layer 210 may be positioned in front or back of the lower electrode 220, e.g., in a vertical direction of the drawing. The insulating layer 210 may enclose only a side part of the lower electrode 220, and the insulating layer 210 may not be formed on the lower electrode 220.

The lower electrode 220 may include a metal such as Al, Cu, W, Ti, or Ta, an alloy such as TiW or TiAl, or C. The lower electrode 220 may also include TiN, TiAlN, TaN, WN, MoN, NbN, TiSiN, TiBN, ZrSiN, WSiN, WBN, ZrAlN, MoAlN, TaSiN, TaAlN, TiON, TiAlON, WON, TaON, TiCN, or TaCN. Also, the lower electrode 220 may be a single layer including one single material of the above-mentioned materials, a single layer including a plurality of materials of the above-mentioned materials, a multilayer each including a single material of the above-mentioned materials, and/or a multilayer each including a plurality of materials of the above-mentioned materials.

The graphene layer 230 may be formed on the lower electrode 220 and the insulating layer 210. The graphene layer 230 may be formed to cover all of the lower electrode 220 and the insulating layer 210. The phase change memory device 200 may be basically driven by a current, and heat generated by current driving may be transferred to the lower electrode 220. In the phase change memory device 200 of FIG. 4, a width of the graphene layer 230 is wider than a width of the lower electrode 220. Therefore, heat flowing into the lower electrode 220 may be diffused in a width direction (or a horizontal direction) of the graphene layer 230 through the graphene layer 230. Therefore, an amount of the heat transferred to the phase change material layer 140 may be controlled.

The phase change material layer 240 may be formed on the graphene layer 230. The phase change material layer 240 may directly contact the graphene layer 230. The phase change material layer 240 is electrically connected to the lower electrode 220. The graphene layer 230 is inserted between the phase change material layer 240 and the lower electrode 220. However, since the graphene layer 230 has a very high electrical conductivity, the phase change material layer 240 and the lower electrode 220 may be electrically connected to each other.

The phase change material layer 240 may be formed by using sputtering, CVD, PECVD, ALD, or the like. The phase change material layer 240 may include a phase change material, such as chalcogenide, that may store data according to different crystalline states. The phase change material may be Ge—Te, Ge—Sb—Te, Ge—Te—Se, Ge—Te—As, Ge—Te—Sn, Ge—Te—Ti, Ge—Bi—Te, Ge—Sn—Sb—Te, Ge—Sb—Se—Te, Ge—Sb—Te—S, Ge—Te—Sn—O, Ge—Te—Sn—Au, Ge—Te—Sn—Pd, Sb—Te, Se—Te—Sn, Sb—Se—Bi, In—Se, In—Sb—Te, Sb—Se, Ag—In—Sb—Te, or a combination thereof. The phase change material layer 240 may also include only the phase change material or a phase change material to which dopant is added. The dopant may be C, N, Si, O, Bi, Sn, or a combination thereof. The phase change material layer 240 may further include a metal material.

The upper electrode 250 may be formed on the phase change material layer 240. The upper electrode 250 may directly contact the phase change material layer 240. The upper electrode 250 may be electrically connected to the phase change material layer 240. The upper electrode 250 may include a metal such as Al, Cu, W, Ti, or Ta, an alloy such as TiW or TiAl, or C. The upper electrode 250 may also include TiN, TiAlN, TaN, WN, MoN, NbN, TiSiN, TiBN, ZrSiN, WSiN, WBN, ZrAlN, MoAlN, TaSiN, TaAlN, TiON, TiAlON, WON, TaON, TiCN, or TaCN. Also, the upper electrode 250 may be a single layer including one single material of the above-mentioned materials, a single layer include a plurality of materials of the above-mentioned materials, a multilayer each including a single material of the above-mentioned materials, and/or a multilayer each including a plurality of materials of the above-mentioned materials. The lower electrode 220 and the upper electrode 250 may be formed of the same material or different materials.

FIGS. 5A through 5F are cross-sectional views illustrating a method of fabricating a phase change memory device according to another example embodiment.

Figure 5A:
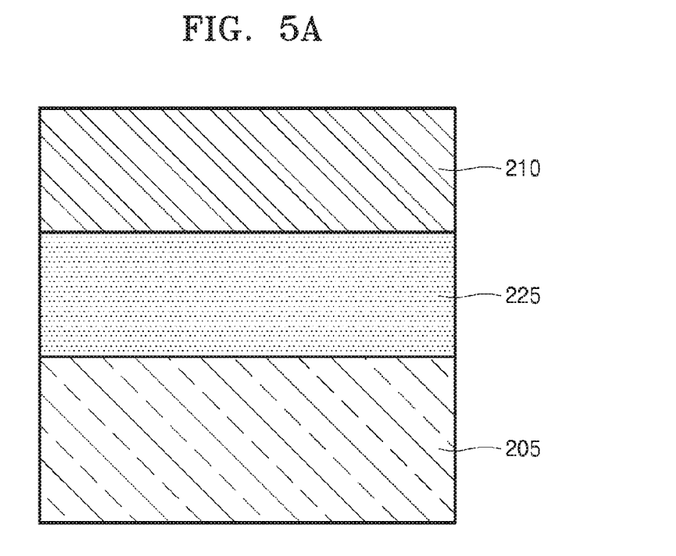
FIGS. 5A through 5F are cross-sectional views illustrating a method of fabricating a phase change memory device according to another example embodiment.

Referring to FIG. 5A, an electrode layer 225 and the insulating layer 210 are sequentially formed on a substrate 205.

The substrate 205 may include a semiconductor material, e.g., a group IV semiconductor, a group III-V compound semiconductor, or a group II-VI oxide semiconductor. For example, the group IV semiconductor may include Si, Ge, or Si—Ge. The substrate 205 may be provided as a bulk wafer or an epitaxial layer. Alternatively, the substrate 205 may be a substrate such as an SOI substrate, a Ga—As substrate, or a Si—Ge substrate.

The electrode layer 225 may be formed on the substrate 205 and may include a metal such as Al, Cu, W, Ti, or Ta, an alloy such as TiW or TiAl, or C.

The insulating layer 210 may be formed on the electrode layer 225 and may include at least one selected from silicon oxide, silicon nitride, and silicon oxynitride.

Figure 5B:
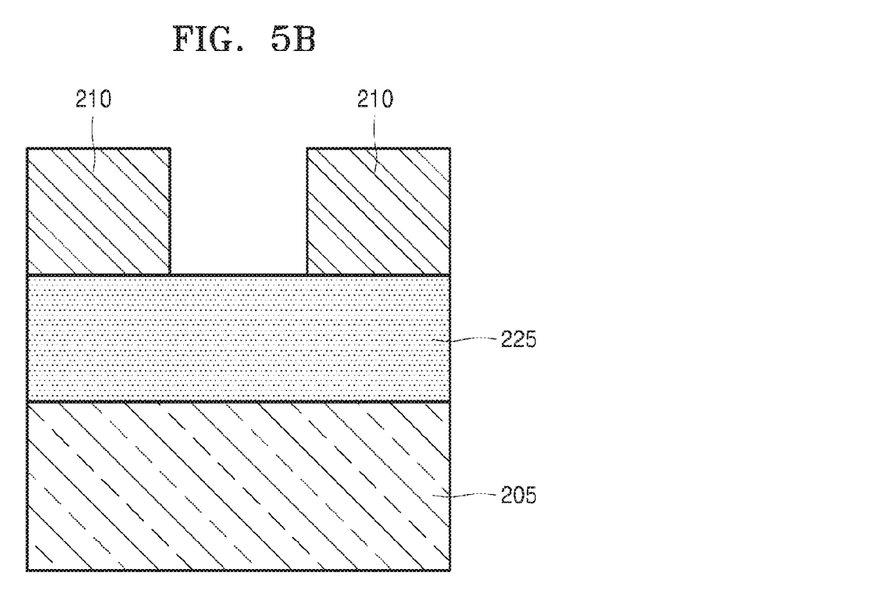

Referring to FIG. 5B, a part of the insulating layer 210 may be patterned to expose the electrode layer 225 to an outside. The insulating layer 210 may be patterned by using a normal photolithography method, an etch method, CMP, a dry etch method, or the like. The above-described process may form a hole in the insulating layer 210 and expose the electrode layer 225 to the outside.

Figure 5C:
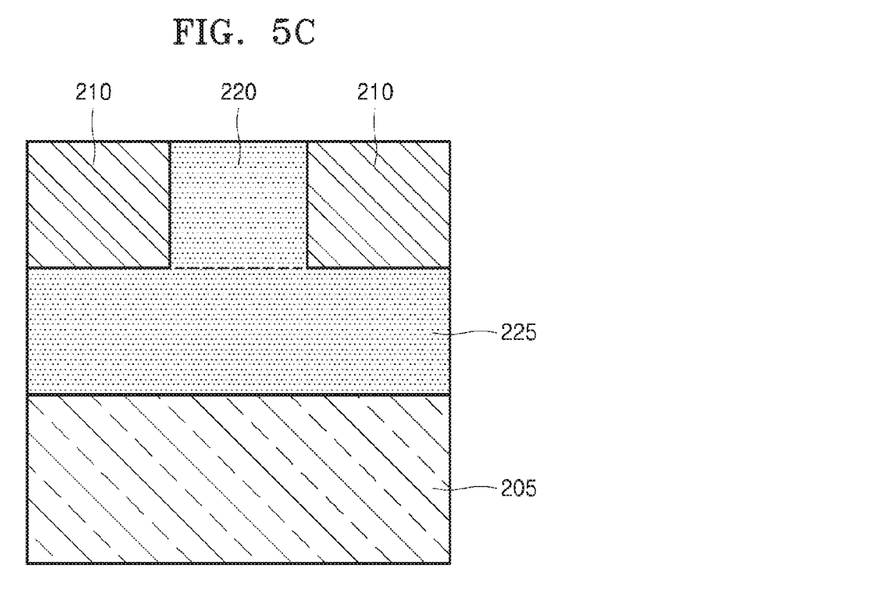

Referring to FIG. 5C, the lower electrode 220 may be formed in the hole formed by the patterning of the insulating layer 210. The lower electrode 220 may be formed by using sputtering, CVD, PECVD, ALD, or the like. The lower electrode 220 may include TiN, TiAlN, TaN, WN, MoN, NbN, TiSiN, TiBN, ZrSiN, WSiN, WBN, ZrAlN, MoAlN, TaSiN, TaAlN, TiON, TiAlON, WON, TaON, TiCN, or TaCN.

The lower electrode 220 may be formed of the same material as the electrode layer 225. However, the lower electrode 220 may not be formed of the same material as the electrode layer 225 and thus may be formed of a different material from the electrode layer 225 to be electrically connected to the electrode layer 225.

The lower electrode 220 may be formed in the patterned part of the insulating layer 210, and then uppermost layers of the lower electrode 220 and the insulating layer 210 may be planarized.

Figure 5D:
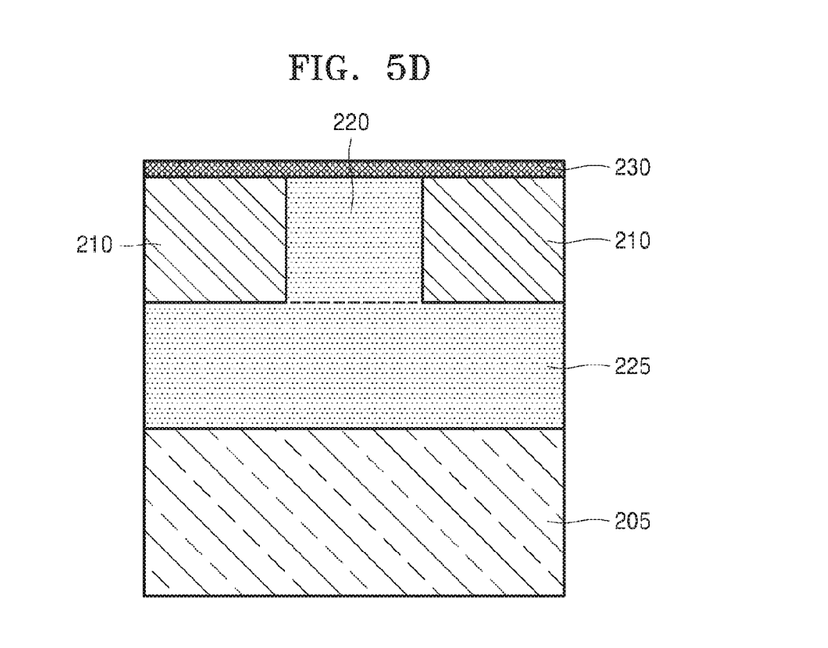

Referring to FIG. 5D, the graphene layer 230 may be formed on the lower electrode 220 and the insulating layer 210. A graphene may be fabricated by CVD and then transferred onto the lower electrode 220 and the insulating layer 210 to form the graphene layer 230. Also, the graphene layer 230 may be formed on the lower electrode 220 and the insulating layer 210 by using a direct growth method.

Figure 5E:
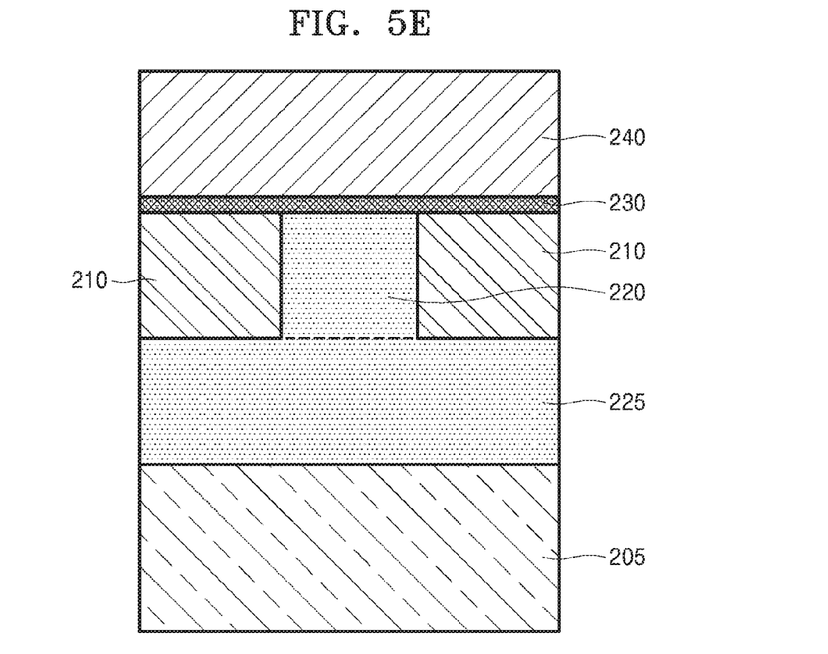
Figure 5F:
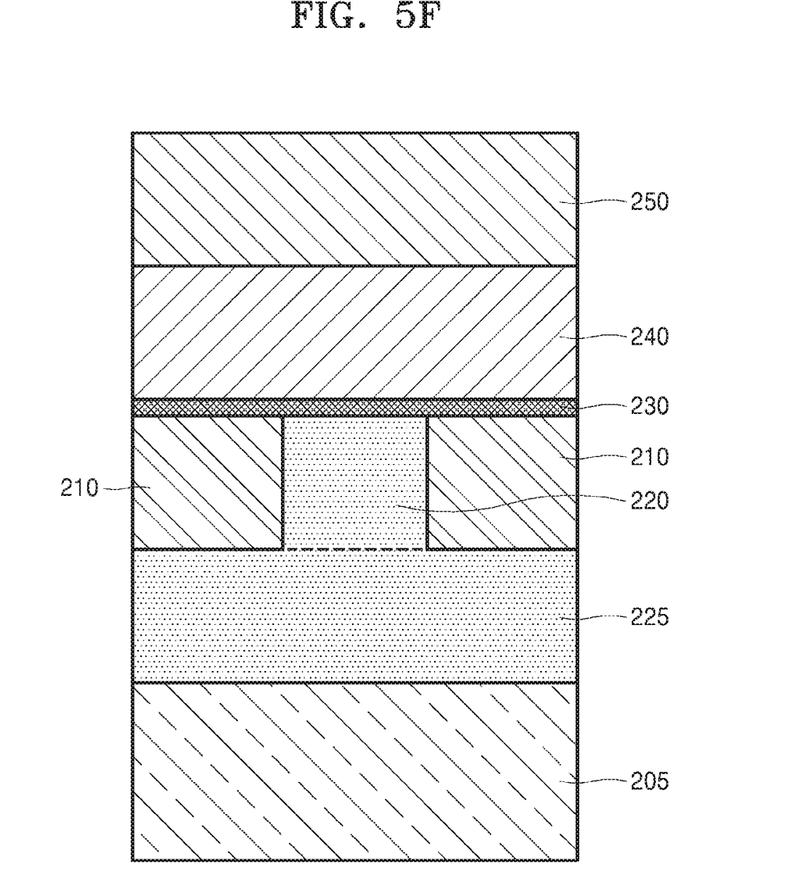

Referring to FIGS. 5E and 5F, the phase change material layer 240 and the upper electrode 250 may be sequentially formed on the graphene layer 230. The phase change material layer 240 and the upper electrode 250 may be formed by using sputtering, CVD, PECVD, ALD, or the like.

According to example embodiments as described, a graphene layer may be formed between a phase change material layer and a lower electrode to efficiently transfer heat energy formed from the lower electrode to the phase change material layer so as to lower a driving current of a phase change memory device. Therefore, a driving speed of the phase change memory device may also increase.

Also, a width of the graphene layer formed between the phase change material layer and the lower electrode may be controlled to control a transferred amount of heat flowing from the lower electrode into the phase change material layer.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims.

What is claimed is:

1. A phase change memory device comprising:
   a lower electrode;
   an insulating layer configured to enclose the lower electrode;
   a graphene layer on the lower electrode;
   a phase change material layer on the graphene layer and the insulating layer; and
   an upper electrode on the phase change material layer.

2. The phase change memory device of claim 1, wherein the graphene layer is only on the lower electrode and is not on the insulating layer.

3. The phase change memory device of claim 1, wherein a width of the graphene layer is equal to a width of the lower electrode.

4. The phase change memory device of claim 1, wherein the phase change material layer comprises a germanium antimony tellurium (GST) material.

5. A phase change memory device comprising:
   a lower electrode;
   an insulating layer configured to enclose the lower electrode;
   a graphene layer on the lower electrode and the insulating layer;
   a phase change material layer on the graphene layer; and
   an upper electrode on the phase change material layer.

6. The phase change memory device of claim 5, wherein the graphene layer covers the lower electrode and covers a part of the insulating layer.

7. The phase change memory device of claim 5, wherein the graphene layer covers the lower electrode and an entirety of the insulating layer.

8. The phase change memory device of claim 5, wherein the phase change material layer comprises a GST material.

9. A method of fabricating a phase change memory device, the method comprising:
   sequentially forming an electrode layer and an insulating layer on a substrate;
   removing a part of the insulating layer to expose the electrode layer;
   forming a lower electrode in the removed part of the insulating layer and then planarizing an uppermost layer of the lower electrode and the insulating layer;
   forming a graphene layer on the lower electrode and the insulating layer;
   removing the graphene layer on the insulating layer; and
   sequentially forming a phase change material layer and an upper electrode on the graphene layer and the insulating layer.

10. The method of claim 9, wherein the graphene layer is formed by using a transfer method or a direct growth method.

11. The method of claim 9, wherein the electrode layer and the lower electrode are formed of a same material.

12. The method of claim 9, wherein all of the graphene layer formed on the insulating layer is removed.

13. The method of claim 9, wherein a part of the graphene layer formed on the insulating layer is removed.

14. A method of fabricating a phase change memory device, the method comprising:
   sequentially forming an electrode layer and an insulating layer on a substrate;

removing a part of the insulating layer to expose the electrode layer;

forming a lower electrode in the removed part of the insulating layer and then planarizing an uppermost layer of the lower electrode and the insulating layer;

forming a graphene layer on the lower electrode and the insulating layer; and sequentially forming a phase change material layer and an upper electrode on the graphene layer.

15. The method of claim 14, wherein the graphene layer is formed by using a transfer method or a direct growth method.

16. The method of claim 14, wherein the electrode layer and the lower electrode are formed of a same material.

17. The method of claim 14, wherein the graphene layer is formed to cover all of the lower electrode and the insulating layer.

* * * * *